(12) United States Patent
Kim

(10) Patent No.: US 8,324,804 B2
(45) Date of Patent: Dec. 4, 2012

(54) ORGANIC LIGHT-EMITTING DISPLAY APPARATUS

(75) Inventor: Eun-Ah Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/018,785

(22) Filed: Feb. 1, 2011

(65) Prior Publication Data

US 2011/0241540 A1   Oct. 6, 2011

(30) Foreign Application Priority Data

Apr. 1, 2010   (KR) .................. 10-2010-0029995

(51) Int. Cl.
*H01J 1/62* (2006.01)
*H01J 63/04* (2006.01)

(52) U.S. Cl. ......... 313/504; 313/498; 313/506; 313/512

(58) Field of Classification Search .......... 313/498–512
See application file for complete search history.

(56) References Cited

U.S. PATENT DOCUMENTS

| 2005/0285990 | A1 | 12/2005 | Havelka et al. | |
|---|---|---|---|---|
| 2006/0279216 | A1* | 12/2006 | Kim et al. | 313/631 |
| 2009/0135115 | A1* | 5/2009 | Sakamoto et al. | 345/84 |
| 2009/0261718 | A1 | 10/2009 | Ha et al. | |
| 2010/0123853 | A1* | 5/2010 | Hao et al. | 349/61 |
| 2010/0301743 | A1* | 12/2010 | Kodama et al. | 313/504 |
| 2011/0007391 | A1* | 1/2011 | Takahashi | 359/485 |
| 2011/0242743 | A1* | 10/2011 | Moon | 361/679.01 |
| 2011/0260959 | A1* | 10/2011 | Son et al. | 345/102 |
| 2011/0260960 | A1* | 10/2011 | Jean et al. | 345/102 |

FOREIGN PATENT DOCUMENTS

| KR | 10-2006-0026512 | 3/2006 |
|---|---|---|
| KR | 10-2008-0073910 | 8/2008 |
| KR | 10-2009-0093058 | 9/2009 |
| KR | 10-2009-0110052 | 10/2009 |

* cited by examiner

*Primary Examiner* — Anh T. Mai
*Assistant Examiner* — Kevin Quarterman
(74) *Attorney, Agent, or Firm* — Robert E. Bushnell, Esq.

(57) ABSTRACT

An organic light-emitting display apparatus with improved durability, the organic light-emitting display apparatus including: a panel assembly including a display unit in which at least one organic light-emitting device is formed; a polarization layer disposed on a first surface of the panel assembly; a cushion tape formed to cover a bottom surface of the panel assembly and at least one side of the panel assembly, and an accommodation member having a bottom portion and a lateral portion, the bottom portion and a lateral portion of the accommodation member contacting the cushion tape to accommodate the panel assembly.

20 Claims, 4 Drawing Sheets

ORGANIC LIGHT-EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on the 1 Apr. 2010 and there duly assigned Serial No. 10-2010-0029995.

BACKGROUND OF THE INVENTION

1. Field of the Invention

The present invention relates to an organic light-emitting display apparatus and, more particularly, to an organic light-emitting display apparatus with improved durability.

2. Description of the Related Art

In recent years, display apparatuses are replaced with flat panel display apparatuses that are portable and small-sized. An organic light-emitting display apparatus, among flat panel display apparatuses, has superior characteristics, such as high brightness, low driving voltage, and short response times and provides multi-color images.

An organic light-emitting display apparatus includes a panel assembly on which a display unit including an organic light-emitting device is disposed. The organic light-emitting device includes a cathode electrode and an anode electrode disposed over an organic emission layer, and when voltage is applied to the cathode electrode and the anode electrode, visible rays are generated in the organic emission layer connected to the cathode electrode and the anode electrode.

An organic light-emitting display apparatus may be damaged while being used due to an external shock, thereby lowering the quality of an image.

In particular, an organic light-emitting display apparatus is widely used as a portable device, and thus, the panel assembly may be damaged if the organic light-emitting display apparatus is inadvertently dropped, or due to external pressure.

SUMMARY OF THE INVENTION

The present invention provides an organic light-emitting display apparatus with improved durability.

According to an aspect of the present invention, an organic light-emitting display apparatus includes: a panel assembly including a display unit in which at least one organic light-emitting device is formed; a polarization layer disposed on a first surface of the panel assembly; and a cushion tape formed to cover an opposite surface to the first surface of the panel assembly and at least one side of the panel assembly.

The polarization layer may have a smaller width than a width of the panel assembly in one direction so that a predetermined region of the first surface is exposed.

One end of the cushion tape may extend long, so as to contact the exposed region of the first surface.

The cushion tape may be connected to a side of the polarization layer, which is opposite to a side of the polarization layer facing the first surface of the panel assembly.

The cushion tape may extend to correspond to one of the sides of the polarization layer.

The polarization layer may have a greater width than one of the widths of the panel assembly.

The cushion tape may contact the exposed region of the polarization layer that does not contact the panel assembly, which corresponds to regions of the polarization layer on which the panel assembly is disposed.

The organic light-emitting display apparatus may further include an accommodation member contacting the cushion tape to accommodate the panel assembly.

The accommodation member may include a bottom portion and a lateral portion to correspond to a bottom surface and sides of the cushion tape, respectively.

The organic light-emitting display apparatus may further include an adhesive layer disposed between the cushion tape and the panel assembly.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings in which exemplary embodiments of the invention are shown.

Figure 1:
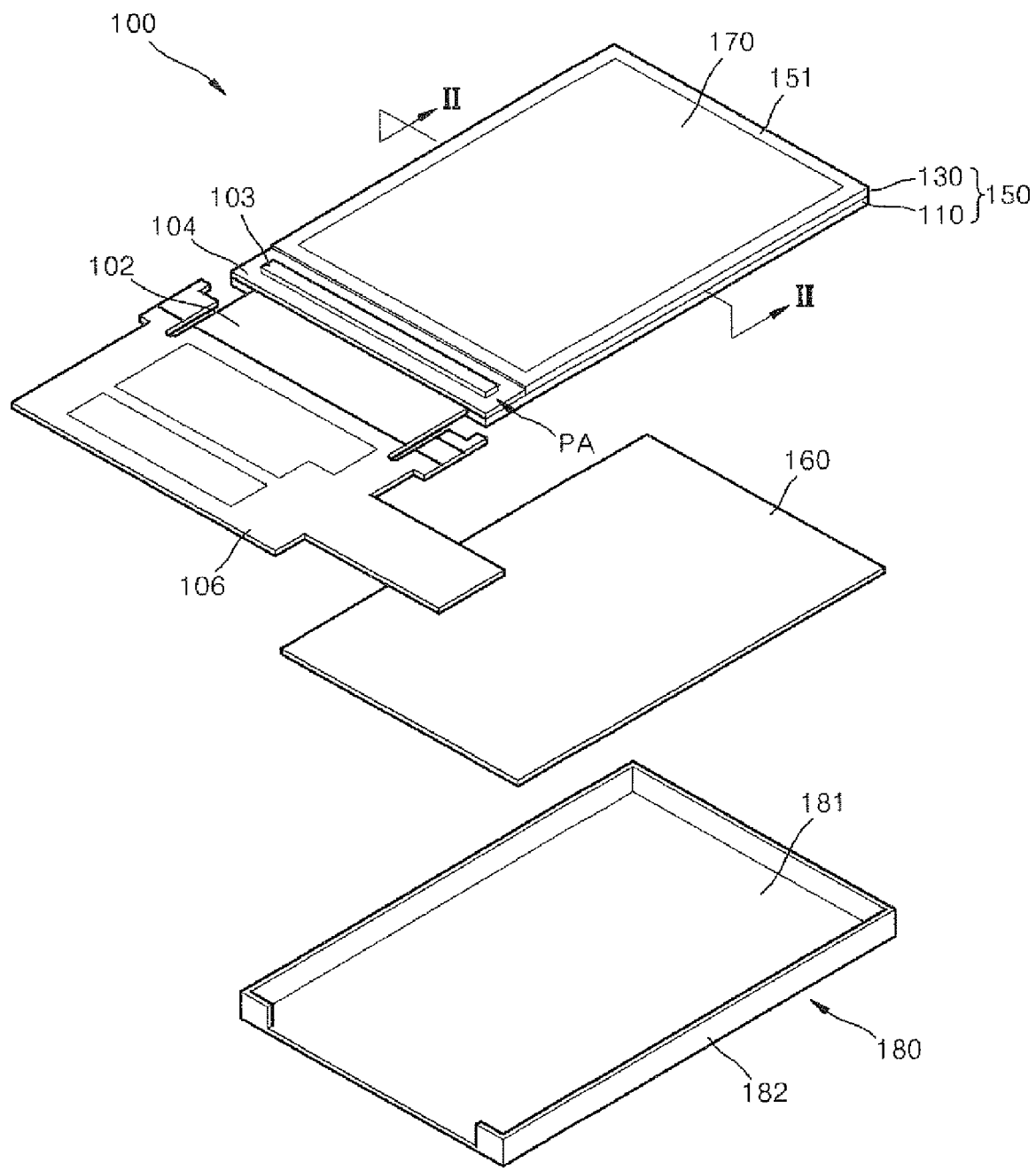
FIG. 1 is an exploded perspective view of an organic light-emitting display apparatus according to an embodiment of the present invention.
Figure 2:
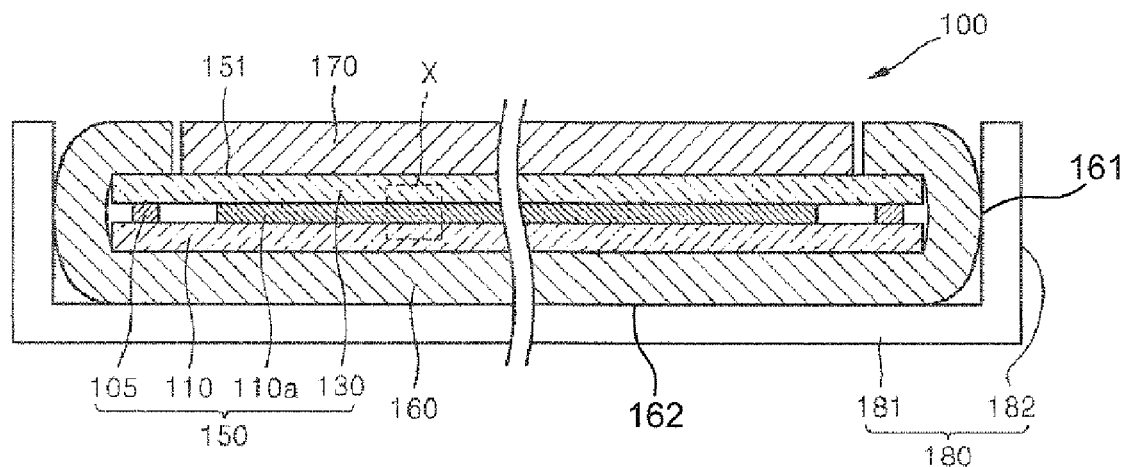
FIG. 2 is a cross-sectional view taken along a line II-II of FIG. 1.

FIG. 1 is an exploded perspective view of an organic light-emitting display apparatus 100 according to an embodiment of the present invention, and FIG. 2 is a cross-sectional view taken along a line II-II of FIG. 1.

Referring to FIG. 1 the organic light-emitting display apparatus 100 includes a panel assembly 150, a cushion tape 160, a polarization layer 170, and an accommodation member 180.

Panel assembly 150 includes a substrate 110, a sealing substrate 130, a first surface 151, and a pad area PA.

An integrated circuit (IC) chip 103 is mounted in the pad area PA. Also, a flexible printed circuit board (FPCB) 102 is mounted in the pad area PA, and the flexible printed circuit board (FPCB) 102 electrically connects the panel assembly 150 and a printed circuit board (PCB) 106 to each other.

A protection layer 104 is formed around the IC chip 103 and the flexible printed circuit board (FPCB) 102 and protects pads formed in the pad area PA. The flexible printed circuit board (FPCB) 102 may be folded around so that the printed circuit board (PCB) 106 may be disposed on a rear surface of an accommodation member 180.

Cushion tape 160 is disposed to correspond to a bottom surface of substrate 110 of the panel assembly 150 and at least one of the sides of the panel assembly 150 (see FIG. 2).

Although not shown, an adhesive layer may be interposed between the cushion tape 160 and the panel assembly 150.

The accommodation member 180 is disposed to accommodate the panel assembly 150. The accommodation member 180 includes a bottom portion 181 and a lateral portion 182.

Referring to FIG. 2, the substrate 110 and the sealing substrate 130 are combined with each other with a sealant 105. The organic light-emitting display apparatus 100, more specifically, the panel assembly 150, also includes a display unit 110a disposed between the substrate 110 and the sealing substrate 130.

Cushion tape 160 is partially wrapped around panel assembly 150 to cover the bottom surface of the panel assembly 150, the sides of the panel assembly 150 and portions of the first surface 151 of sealing substrate 130. The cushion tape 160 may be formed to correspond to three sides of the panel assembly 150, excluding a portion connected to the printed circuit board (PCB) 106, among the sides of the panel assembly 150, so as to protect the sides of the panel assembly 150. The cushion tape 160 is formed of material that is elastic and adhesive. The cushion tape 160 extends long, so as to contact portions of the exposed portions of the first surface 151 of the panel assembly 150.

Bottom portion 181 of accommodation member 180 corresponds to the exposed bottom surface 162 of the cushion tape 160, and the lateral portion 182 corresponds to the exposed sides 161 of the cushion tape 160. The panel assembly 150 is fixed on the accommodation member 180 with the cushion tape 160.

Polarization layer 170 is formed on the first surface 151, i.e., the top surface of sealing substrate 130 of the panel assembly 150. The polarization layer 170 is formed to prevent external light reflection. The polarization layer 170 has a smaller width than a width of the panel assembly 150. In detail, the polarization layer 170 does not completely cover the first surface 151 but exposes portions of the first surface 151.

In the organic light-emitting display apparatus 100 illustrated in FIGS. 1 and 2, the cushion tape 160 is disposed on the bottom surface and the sides of the panel assembly 150. Thus, when an external shock is applied to the organic light-emitting display apparatus 100, the cushion tape 160 prevents the sides of the panel assembly 150 from being damaged. Also, the cushion tape 160 easily prevents an impurity from permeating the sides of the panel assembly 150.

Also, the cushion tape 160 helps, making it easier, to bond the panel assembly 150 to the accommodation member 180. Also, the cushion tape 160 facilitates the panel assembly 150 to bond to the accommodation member 180. When any shock is applied to the accommodation member 180, the cushion tape 160 alleviates the shock so that the effect of the shock may not be transferred to the panel assembly 150.

Also, one end of the cushion tape 160 is connected to the top surface of the panel assembly 150, i.e., the exposed portions of the first surface 151 of the panel assembly 150 so that the cushion tape 160 may easily protect edge portions of the first surface 151 of the panel assembly 150.

Figure 3:
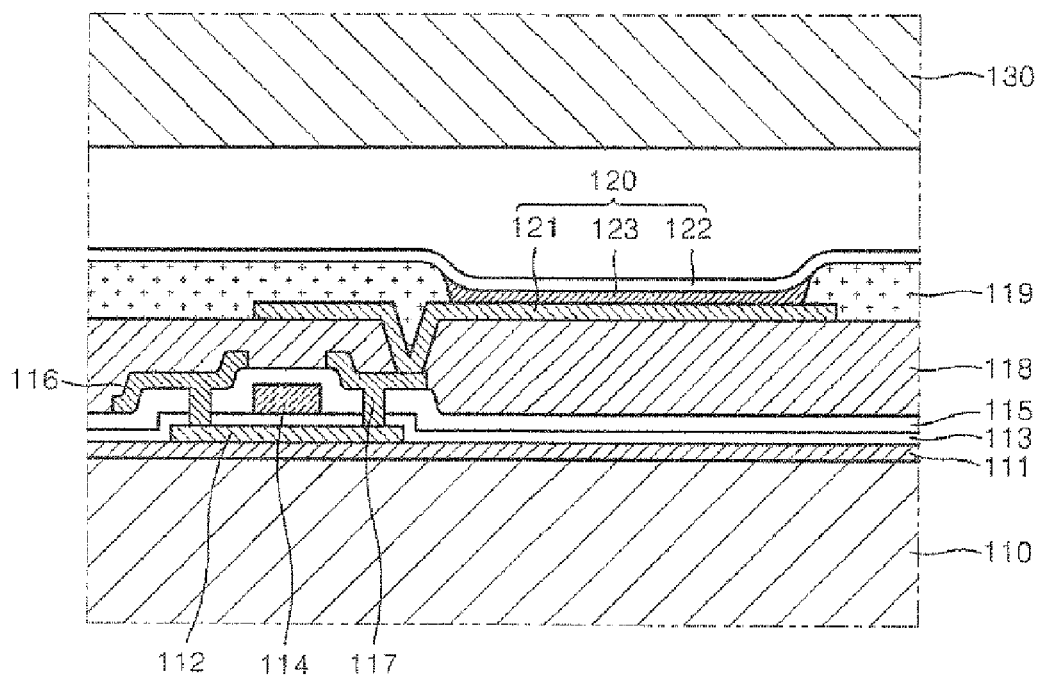
FIG. 3 is an enlarged view of a portion X of FIG. 2.

FIG. 3 is an enlarged view of a portion X of FIG. 2

The structure of the display unit 110a will be described in detail with reference to FIG. 3. FIG. 3 illustrates one organic light-emitting device 120 disposed between the substrate 110 and the sealing substrate 130, for explanatory convenience, and a plurality of organic light-emitting devices 120 may be included in the display unit 110a.

The substrate 110 may be formed of transparent glass that mainly contains Silicon Dioxide ($SiO_2$). The substrate 110 is not limited thereto and may be formed of transparent plastic. In this regard, transparent plastic for forming the substrate 110 may be an organic material selected from the group consisting of polyethersulphone (PES), polyacrylate (PAR), polyetherimide (PEI), polyethyelenen napthalate (PEN), polyethyelenetereptahalate (PET), polyphenylene sulfide (PPS), polyallylate, polyimide, polycarbonate (PC), cellulose triacetate (TAC), and cellulose acetate propionate (CAP), which are insulating organic materials.

A buffer layer 111 is formed on the substrate 110. The buffer layer 111 is formed to form a flat surface on an upper portion of the substrate 110 and to prevent moisture or foreign substances from permeating the substrate 110. An active layer 112 having a predetermined pattern is formed on the buffer layer 111. The active layer 112 may be formed of an inorganic or organic semiconductor, such as amorphous silicon or polysilicon. The active layer 112 may include a source region, a drain region, and a channel region.

The source and drain regions may be formed by doping the active layer 112 formed of amorphous silicon or polysilicon with an impurity. When the active layer 112 is doped with the Group III element boron (B) or the like, a p-type semiconductor may be formed, and when the active layer 112 is doped with the Group V element nitrogen (N) or the like, an n-type semiconductor may be formed.

A gate insulating layer 113 is formed on the active layer 112, and a gate electrode 114 is formed in a predetermined region of the gate insulating layer 113. The gate insulating layer 113 is used to insulate the active layer 112 from the gate electrode 114. The gate insulating layer 113 may be formed of an organic material or an inorganic material, such as SiNx (Silicon Nitride) or $SiO_2$.

The gate electrode 114 may be formed of metal, such as Au, Ag, Cu, Ni, Pt, Pd, Al, Mo, or an alloy of metal, such as Al:Nd, Mo:W alloy, or the like. However, the present invention is not limited thereto, and the gate electrode 114 may be formed of various materials in consideration of adhesion, flatness, electrical resistance, processability, or the like. The gate electrode 114 is connected to a gate line (not shown) via which an electrical signal is applied.

An interlayer insulating layer 115 is formed on the gate electrode 114. The interlayer insulating layer 115 and the gate insulating layer 113 are formed in such a way (e.g., through holes) that the source and drain regions of the active layer 112 may be exposed and a source electrode 116 and a drain electrode 117 may contact the exposed source and drain regions of the active layer 112, respectively.

Materials for forming the source electrode 116 and the drain electrode 117 may be Al, Mo, or an alloy including two kinds of metal, such as an Al:Nd alloy, a MoW alloy, or the like, as well as Au, Pd, Pt, Ni, Rh, Ru, Ir, and Os. However, the present invention is not limited thereto.

A passivation layer 118 is formed to cover the interlayer insulating layer 115, the source electrode 116 and the drain electrode 117. The passivation layer 118 may be an inorganic insulating layer and/or an organic insulating layer. The inorganic insulating layer may be formed of material such as $SiO_2$, SiNx, SiON, $Al_2O_3$, $TiO_2$, $Ta_2O_5$, $HfO_2$, $ZrO_2$, BST or PZT, and the organic insulating layer may be formed of polymer derivative, acryl-based polymer, imide-based polymer, arylether-based polymer, amide-based polymer, fluoropolymer, p-xylene-based polymer, vinylalcohol-based polymer, or a blend thereof. The passivation layer 118 may be formed of a stack structure of inorganic insulating layers and organic insulating layers.

The passivation layer 118 is formed (e.g., with a through hole) exposing the drain electrode 117 to which the organic light-emitting device 120 is connected. The organic light-emitting device 120 includes a first electrode 121, a second electrode 122, and an intermediate layer 123. In detail, the first electrode 121 and the drain electrode 117 contact each other via passivation layer 118.

The intermediate layer 123 includes an organic emission layer, and when a voltage is applied to the intermediate layer 123 via the first electrode 121 and the second electrode 122, visible rays are generated.

A pixel defining layer 119 is formed of an insulating material on the first electrode 121. A predetermined opening is formed in the pixel defining layer 119 so that a portion of the first electrode 121 may be exposed through the opening. The intermediate layer 123 is formed on the exposed portion of the first electrode 121. The second electrode 122 is formed to be connected to the intermediate layer 123.

The first electrode 121 and the second electrode 122 have polarities of an anode electrode and a cathode electrode, respectively. However, the polarities of the first electrode 121 and the second electrode 122 may be the reverse.

The sealing substrate 130 is disposed on the second electrode 122. The sealing substrate 130 is formed to protect the organic light-emitting device 120 and other layers from external moisture, oxygen, or other contaminants.

Figure 4:
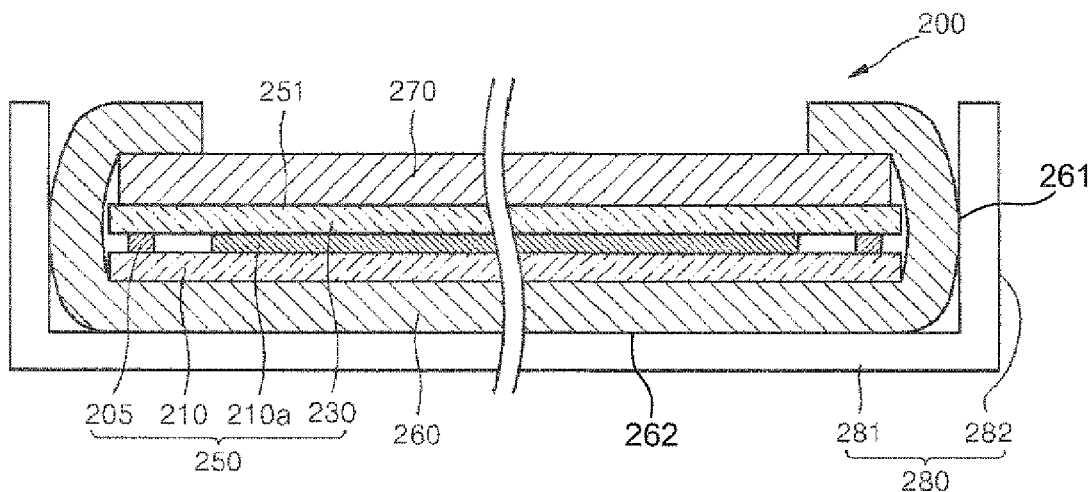
FIG. 4 is a schematic cross-sectional view of an organic light-emitting display apparatus according to another embodiment of the present invention.

FIG. 4 is a schematic cross-sectional view of an organic light-emitting display apparatus 200 according to another embodiment of the present invention. For explanatory convenience, differences between the organic light-emitting display apparatuses 200 and 100 of FIG. 4 and FIG. 1 will now be described.

Referring to FIG. 4, the organic light-emitting display apparatus 200 includes a panel assembly 250 including a display unit 210a, a cushion tape 260, a polarization layer 270, and an accommodation member 280.

In detail, the panel assembly 250 includes a substrate 210 and a sealing substrate 230, where the substrate 210 and the sealing substrate 230 are combined with each other with a sealant 205.

The polarization layer 270 is disposed on a first surface 251, i.e., a top surface of the panel assembly 250. The polarization layer 270 is formed to prevent external light reflection. In FIG. 4, the width of the polarization layer 270 is nearly the same as the width of the panel assembly 250. However, the present invention is not limited thereto. Since the width of the polarization layer 270 is small, the first surface 251 of the panel assembly 250 may be exposed, as illustrated in FIG. 4.

The cushion tape 260 is disposed on a bottom surface of substrate 210 of the panel assembly 250 and at least one of the sides of the panel assembly 250. The cushion tape 260 extends long, so as to contact a side of the polarization layer 270, which is opposite to a side of the polarization layer 270 facing the first surface 251 of the panel assembly 250. Thus, the cushion tape 260 covers the bottom surface, wraps over the sides of the panel assembly 250 and extends over edge portions of a top surface of the polarization layer 270.

Although not shown, an adhesive layer may be further interposed between the cushion tape 260 and the panel assembly 250.

The accommodation member 280 is disposed to accommodate the panel assembly 250. The accommodation member 280 includes a bottom portion 281 and a lateral portion 282 to correspond to a bottom surface 262 and sides 261 of the cushion tape 260, respectively. The panel assembly 250 is fixed on the accommodation member 280 with the cushion tape 260.

The structure of the display unit 210a is the same as that of the display unit 110a of FIG. 3, and thus, a detailed description thereof will not be provided here.

In the organic light-emitting display apparatus 200 illustrated in FIG. 4, the cushion tape 260 is disposed on the bottom surface and the sides of the panel assembly 250 and the sides of the polarization layer 270. Thus, when an external shock is applied to the organic light-emitting display apparatus 200, the cushion tape 260 prevents the sides of the panel assembly 250 from being damaged. In particular, since the cushion tape 260 is connected to a top surface of the polarization layer 270, the cushion tape 260 efficiently protects lateral edge portions of the polarization layer 270. Also, the cushion tape 260 easily prevents an impurity from permeating the sides of the panel assembly 250.

Also, the cushion tape 260 helps, making it easier, to bond the panel assembly 250 to the accommodation member 280. Also, the cushion tape 260 facilitates the panel assembly 250 to bond to the accommodation member 280. When any shock is applied to the accommodation member 280, the cushion tape 260 alleviates the shock so that the effect of the shock may not be transferred to the panel assembly 250.

Figure 5:
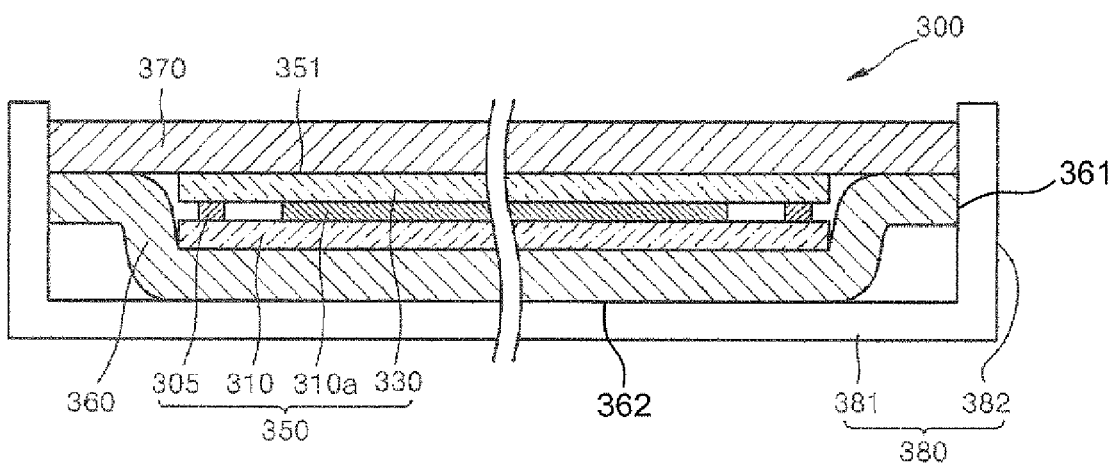
FIG. 5 is a schematic cross-sectional view of an organic light-emitting display apparatus according to another embodiment of the present invention.

FIG. 5 is a schematic cross-sectional view of an organic light-emitting display apparatus 300 according to another embodiment of the present invention. For explanatory convenience, differences between the organic light-emitting display apparatus 300 of FIG. 5 and the organic light-emitting display apparatuses 100 and 200 of FIGS. 2 and 4 will now be described.

Referring to FIG. 5, the organic light-emitting display apparatus 300 includes a panel assembly 350 including a display unit 310a, a cushion tape 360, a polarization layer 370, and an accommodation member 380.

In detail, the panel assembly 350 includes a substrate 310 and a sealing substrate 330, where the substrate 310 and the sealing substrate 330 are combined with each other with a sealant 305.

The polarization layer 370 is disposed on a first surface 351, i.e., a top surface of sealing substrate 330 of the panel assembly 350. The polarization layer 370 is formed to prevent external light reflection. The polarization layer 370 has at least one width that is greater than a width of the panel assembly 350. Thus, the exposed region of a bottom surface 371 of the polarization layer 370 corresponds to regions of the polarization layer 370 on which the panel assembly 350 is not disposed.

The cushion tape 360 is disposed to correspond to a bottom surface of substrate 310 of sealing substrate 330 of the panel assembly 350 and at least one of the sides of the panel assembly 350. The cushion tape 360 extends long, so as to contact the exposed region of the polarization layer 370 that does not contact sealing substrate 330 of the panel assembly 350, which corresponds to regions of the polarization layer 370 on which the panel assembly 350 is disposed.

Thus, the cushion tape 360 covers a bottom surface and the sides of the panel assembly 350 and is connected to portions of the bottom surface 371 of the polarization layer 370.

Although not shown, an adhesive layer may be further interposed between the cushion tape 360 and the panel assembly 350.

The accommodation member 380 is disposed to accommodate the panel assembly 350. The accommodation member 380 includes a bottom portion 381 and a lateral portion 382 to correspond to a bottom surface 362 and side edges 361 of the cushion tape 360, respectively. The panel assembly 350 is fixed on the accommodation member 380 with the cushion tape 360.

The structure of the display unit 310a is the same as that of the display unit 110a of FIG. 3, and thus, a detailed description thereof will not be provided here.

In the organic light-emitting display apparatus 300 illustrated in FIG. 5, the cushion tape 360 is disposed on the bottom surface and the sides of the panel assembly 350. Also, since at least one of the widths of the polarization layer 370 is greater than the width of the panel assembly 350, the polarization layer 370 has the exposed region of the bottom surface 371 that does not contact the panel assembly 350. The cushion tape 360 is disposed on the exposed region of the bottom surface 371 of the polarization layer 370.

Thus, when an external shock is applied to the organic light-emitting display apparatus 300, the cushion tape 360 prevents the sides of the panel assembly 350 to be damaged. Additionally, since the cushion tape 360 contacts the exposed region of the bottom surface 371 of the polarization layer 370, it efficiently prevents an impurity from permeating the sides of the panel assembly 350.

Also, the cushion tape 260 helps, making it easier, to bond the panel assembly 250 to the accommodation member 280. Also, the cushion tape 260 facilitates the panel assembly 250 to bond to the accommodation member 280. When any shock is applied to the accommodation member 380, the cushion tape 360 alleviates the shock so that the effect of the shock may not be transferred to the panel assembly 350.

Figure 6:
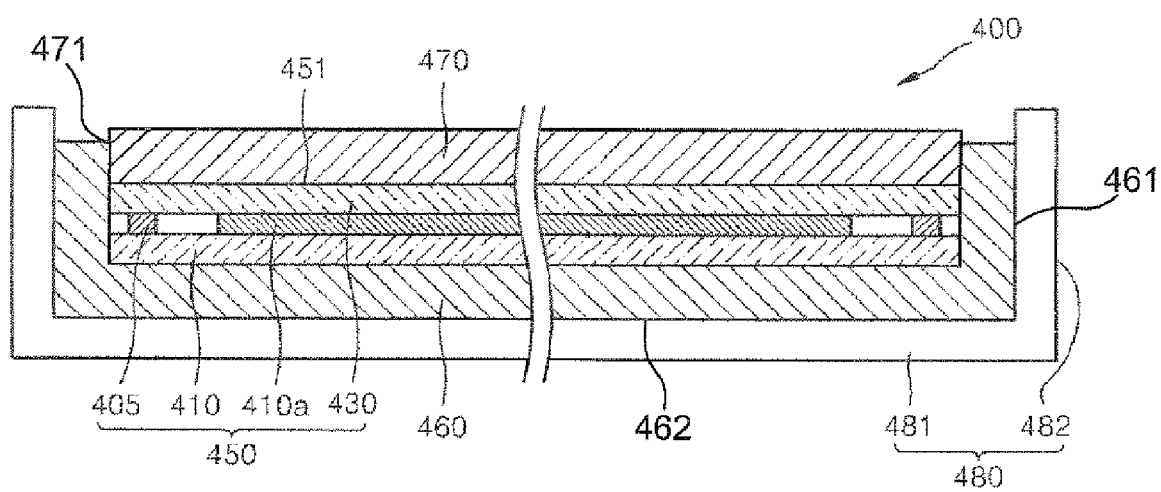
FIG. 6 is a schematic cross-sectional view of an organic light-emitting display apparatus according to another embodiment of the present invention.

FIG. 6 is a schematic cross-sectional view of an organic light-emitting display apparatus 400 according to another embodiment of the present invention. For explanatory convenience, differences between the organic light-emitting display apparatus 400 of FIG. 6 and the organic light-emitting display apparatuses 100, 200, and 300 of FIGS. 2, 4, and 5 will now be described.

Referring to FIG. 6, the organic light-emitting display apparatus 400 includes a panel assembly 450 including a display unit 410a, a cushion tape 460, a polarization layer 470, and an accommodation member 480.

In detail, the panel assembly 450 includes a substrate 410 and a sealing substrate 430, and the substrate 410 and the sealing substrate 430 are combined with each other with a sealant 405.

The polarization layer 470 is disposed on a first surface 451, i.e., a top surface of sealing substrate 430 of the panel assembly 450. The polarization layer 470 is formed to prevent external light reflection. In FIG. 6, the width of the polarization layer 470 is the same as the width of sealing substrate 430 of the panel assembly 450. However, the present invention is not limited thereto. As illustrated in FIG. 6, since the width of the polarization layer 470 is the same as the width of the panel assembly 450, the first surface 451 of sealing substrate 430 of the panel assembly 450 is not exposed.

The cushion tape 460 is disposed to correspond to a bottom surface of substrate 410 of the panel assembly 450 and at least one of the sides of the panel assembly 450. The cushion tape 460 extends partially over the sides 471 of the polarization layer 470. In detail, the cushion tape 460 extends long, so as to contact the sides 471 of the polarization layer 470.

Although not shown, an adhesive layer may be further interposed between the cushion tape 460 and the panel assembly 450.

The accommodation member 480 is disposed to accommodate the panel assembly 450. The accommodation member 480 includes a bottom portion 481 and a lateral portion 482 to correspond to a bottom surface 462 and sides 461 of the cushion tape 460. The panel assembly 450 is fixed on the accommodation member 480 with the cushion tape 460.

The structure of the display unit 410a is the same as that of the display unit 110a of FIG. 3, and thus, a detailed description thereof will not be provided here.

In the organic light-emitting display apparatus 400 illustrated in FIG. 6, the cushion tape 460 is disposed on the bottom surface and the sides of the panel assembly 450 and the sides 471 of the polarization layer 470. Thus, when an external shock is applied to the organic light-emitting display apparatus 400, the cushion tape 460 prevents the sides of the panel assembly 450 from being damaged. Additionally, the cushion tape 460 is adjacent the sides of the polarization layer 470, and thus, efficiently prevents an impurity from permeating the sides of the panel assembly 450.

Also, the cushion tape 460 helps, making it easier, to bond the panel assembly 450 to the accommodation member 480. Also, the cushion tape 460 facilitates the panel assembly 450 to bond to the accommodation member 480. When any shock is applied to the accommodation member 480, the cushion tape 460 alleviates the shock so that the effect of the shock may not be transferred to the panel assembly 450.

As described above, in an organic light-emitting display apparatus according to the present invention, durability may be easily improved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus comprising:
   a panel assembly comprising a display unit in which at least one organic light-emitting device is formed;
   a polarization layer disposed on a first surface of the panel assembly; and
   a cushion tape formed to cover an opposite surface to the first surface of the panel assembly and at least one side of the panel assembly.

2. The organic light-emitting display apparatus of claim 1, wherein the polarization layer has a smaller width than a width of the panel assembly in one direction so that a predetermined region of the first surface is exposed.

3. The organic light-emitting display apparatus of claim 2, wherein one end of the cushion tape extends long, so as to contact the exposed region of the first surface.

4. The organic light-emitting display apparatus of claim 1, wherein the cushion tape is connected to an upper surface of the polarization layer, which is opposite to a bottom surface of the polarization layer facing the first surface of the panel assembly.

5. The organic light-emitting display apparatus of claim 1, wherein the cushion tape extends to correspond to one of the sides of the polarization layer.

6. The organic light-emitting display apparatus of claim 1, wherein the polarization layer has a greater width than one of the widths of the panel assembly.

7. The organic light-emitting display apparatus of claim 6, wherein the cushion tape contacts an exposed region of the polarization layer that does not contact the panel assembly, which corresponds to regions of the polarization layer on which the panel assembly is disposed.

8. The organic light-emitting display apparatus of claim 1, further comprising an accommodation member contacting the cushion tape to accommodate the panel assembly.

9. The organic light-emitting display apparatus of claim 8, wherein the accommodation member comprises a bottom portion and a lateral portion to correspond to a bottom surface and sides of the cushion tape, respectively.

10. The organic light-emitting display apparatus of claim 1, further comprising an adhesive layer disposed between the cushion tape and the panel assembly.

11. An organic light-emitting display apparatus comprising:
    a panel assembly comprising:
       a base substrate;

a display unit disposed on the base substrate, the display unit comprising organic light-emitting device;

a sealing substrate disposed on the display unit; and a sealant connecting the base substrate to the sealing substrate;

a polarization layer disposed on an upper surface of the sealing substrate; and a cushion tape formed to cover a bottom surface to the base substrate of the panel assembly and at least one side of the panel assembly.

12. The organic light-emitting display apparatus of claim 11, said polarization layer being smaller than said sealing substrate, said cushion tape being wrapped over an exposed edge portion of the upper surface of the sealing substrate.

13. The organic light-emitting display apparatus of claim 11, said polarization layer being smaller than said sealing substrate, said cushion tape being wrapped over an edge portion of an upper surface of the polarization layer.

14. The organic light-emitting display apparatus of claim 11, said polarization layer being larger than said sealing substrate, said cushion tape being further formed to cover an exposed edge portion of a bottom surface of the polarization layer.

15. The organic light-emitting display apparatus of claim 11, said polarization layer being and said sealing substrate having a similar dimension, said cushion tape being further formed to partially cover a side portion of the polarization layer.

16. The organic light-emitting display apparatus of claim 11, further comprising an accommodation member having a bottom portion and a lateral portion, the bottom portion and a lateral portion of the accommodation member contacting the cushion tape to accommodate the panel assembly.

17. The organic light-emitting display apparatus of claim 12, further comprising an accommodation member having a bottom portion and a lateral portion, the bottom portion and a lateral portion of the accommodation member contacting the cushion tape to accommodate the panel assembly.

18. The organic light-emitting display apparatus of claim 13, further comprising an accommodation member having a bottom portion and a lateral portion, the bottom portion and a lateral portion of the accommodation member contacting the cushion tape to accommodate the panel assembly.

19. The organic light-emitting display apparatus of claim 14, further comprising an accommodation member having a bottom portion and a lateral portion, the bottom portion and a lateral portion of the accommodation member contacting the cushion tape to accommodate the panel assembly.

20. The organic light-emitting display apparatus of claim 15, further comprising an accommodation member having a bottom portion and a lateral portion, the bottom portion and a lateral portion of the accommodation member contacting the cushion tape to accommodate the panel assembly.

* * * * *